United States Patent
Wordsworth et al.

(10) Patent No.: US 10,630,076 B2
(45) Date of Patent: Apr. 21, 2020

(54) ELECTRICAL ENERGY STORAGE DEVICE AND SYSTEM

(71) Applicant: Powervault Limited, London (GB)

(72) Inventors: Andrew Wordsworth, Tonbridge (GB); Anthony Duffin, Didcot (GB); Thomas Duffin, Didcot (GB)

(73) Assignee: Powervault Limited, London (GB)

( * ) Notice: Subject to any disclaimer, the term of this patent is extended or adjusted under 35 U.S.C. 154(b) by 622 days.

(21) Appl. No.: 14/778,768

(22) PCT Filed: Mar. 21, 2014

(86) PCT No.: PCT/GB2014/050898
§ 371 (c)(1),
(2) Date: Sep. 21, 2015

(87) PCT Pub. No.: WO2014/147420
PCT Pub. Date: Sep. 25, 2014

(65) Prior Publication Data
US 2016/0049790 A1     Feb. 18, 2016

(30) Foreign Application Priority Data
Mar. 21, 2013   (GB) .................................. 1305227.9

(51) Int. Cl.
*H02J 7/00* (2006.01)
*H02J 3/32* (2006.01)
(Continued)

(52) U.S. Cl.
CPC ............... *H02J 3/32* (2013.01); *G01R 25/00* (2013.01); *G05B 15/02* (2013.01); *H02J 7/34* (2013.01);
(Continued)

(58) Field of Classification Search
None
See application file for complete search history.

(56) References Cited

U.S. PATENT DOCUMENTS

2009/0222143 A1* 9/2009 Kempton ............ B60L 11/1824
700/291
2009/0295227 A1   12/2009 Chang et al.
(Continued)

FOREIGN PATENT DOCUMENTS

CN    103560537    2/2014
DE    102011001284  9/2012
(Continued)

OTHER PUBLICATIONS

"United Kingdom Application No. GB1305227.9, Office Action dated Jun. 29, 2016", (Jun. 29, 2016), 3 pgs.
(Continued)

*Primary Examiner* — Paul B Yanchus, III
(74) *Attorney, Agent, or Firm* — Schwegman Lundberg & Woessner, P.A.

(57) ABSTRACT

An electrical energy storage device comprises an electrical connection arranged to detachably connect to a power distribution system on a site; an energy store having an input arranged selectively to charge the energy store from the distribution system, and an output arranged selectively to discharge the energy store to the distribution system; a processor arranged to monitor at least one condition relating to the site, and to monitor at least one condition relating to the energy store, and to control the energy store to charge or to discharge dependent upon the monitored conditions; and preferably a communication interface for the processor. Such a device could be provided in a domestic site, in particular a site having a generation capacity such as PV panels, in order for the energy consumer at the site to obtain
(Continued)

an electrical energy supply more efficiently or more cheaply, and in order to smooth out fluctuations in energy supply and/or demand from the site.

19 Claims, 12 Drawing Sheets

(51) Int. Cl.
    *H02J 7/34*                (2006.01)
    *G01R 25/00*             (2006.01)
    *G05B 15/02*             (2006.01)
    *H02J 13/00*             (2006.01)

(52) U.S. Cl.
    CPC ............ *H02J 13/001* (2013.01); *Y02B 10/14* (2013.01); *Y02B 90/222* (2013.01); *Y02E 10/566* (2013.01); *Y02E 40/72* (2013.01); *Y02E 40/76* (2013.01); *Y02E 60/722* (2013.01); *Y02E 70/30* (2013.01); *Y04S 10/123* (2013.01); *Y04S 10/14* (2013.01); *Y04S 10/40* (2013.01); *Y04S 10/545* (2013.01); *Y04S 20/12* (2013.01)

(56) References Cited

U.S. PATENT DOCUMENTS

| | | |
|---|---|---|
| 2010/0276998 A1 | 11/2010 | Luo et al. |
| 2011/0004357 A1* | 1/2011 | Mathiowetz ............ H02J 3/14 700/295 |
| 2011/0125337 A1 | 5/2011 | Zavadsky et al. |
| 2011/0148205 A1 | 6/2011 | Moon |
| 2012/0005126 A1* | 1/2012 | Oh ..................... G06Q 50/06 705/412 |
| 2012/0150709 A1 | 6/2012 | Kaji |
| 2012/0229077 A1 | 9/2012 | Tsuchiya |
| 2012/0316690 A1 | 12/2012 | Li et al. |
| 2012/0323387 A1* | 12/2012 | Ozaki ..................... H02J 7/35 700/291 |
| 2013/0024042 A1* | 1/2013 | Asghari ............... H02J 3/381 700/295 |
| 2013/0154570 A1* | 6/2013 | Nomura ................ H02J 3/32 320/128 |
| 2014/0103855 A1* | 4/2014 | Wolter ..................... H02J 7/35 320/101 |

FOREIGN PATENT DOCUMENTS

| | | |
|---|---|---|
| EP | 2458704 | 5/2012 |
| EP | 2475060 | 7/2012 |
| EP | 2648007 | 10/2013 |
| ES | 1078677 | 2/2013 |
| GB | 2455421 | 6/2009 |
| GB | 2462913 | 3/2010 |
| GB | 2486392 | 6/2012 |
| GB | 2487642 | 8/2012 |
| GB | 2510153 | 7/2014 |
| GB | 2522678 | 8/2015 |
| GB | 2527473 | 12/2015 |
| WO | WO-2009037163 | 3/2009 |
| WO | WO-2012073533 | 6/2012 |
| WO | WO-2012169879 | 12/2012 |
| WO | WO-2014/147420 | 9/2014 |

OTHER PUBLICATIONS

"International Application No. PCT/GB2014/050898, International Search Report dated Sep. 15, 2014", (Sep. 15, 2014), 5 pgs.
"United Kingdom Application No. GB1305227.9, Search Report Under Section 17 dated Jul. 30, 2014", (Jul. 30, 2014), 2 pgs.
"United Kingdom Application GB1518658.8, Search Report Under Section 17(6) dated Dec. 16, 2016", (Dec. 16, 2016), 3 pgs.
"United Kingdom Application GB1305227.9, Examination Report dated Mar. 28, 2017", (Mar. 28, 2017), 4 pgs.

* cited by examiner

Figure 5 : Power delivery and control flow chart; draft a

ELECTRICAL ENERGY STORAGE DEVICE AND SYSTEM

PRIORITY CLAIM TO RELATED APPLICATIONS

This application is a U.S. national stage application filed under 35 U.S.C. § 371 from International Application Serial No. PCT/GB2014/050898, which was filed 21 Mar. 2014, and published as WO2014/147420 on 25 Sep. 2014, and which claims priority to United Kingdom Application No. 1305227.9, filed 21 Mar. 2013, which applications and publication are incorporated by reference as if reproduced herein and made a part hereof in their entirety, and the benefit of priority of each of which is claimed herein.

This invention relates to a system for storing and releasing electrical energy. The system is of particular use in domestic or similar environments.

Generation, supply and distribution systems for electrical energy generally require a storage facility for occasional use, for example to deal with situations of very high demand over a short duration, or emergency situations where a large generating capacity fails. This is because the output from power stations cannot be precisely matched to demand for power, which tends to vary dramatically over very short periods of time. Peak power demand is commonly around double the lowest level of demand in a single day.

An example of a traditional type of storage system is a hydro storage facility, in which water is stored at a high altitude in a reservoir and is discharged through turbines during times of peak electricity demand to provide additional power to the supply system. The water is pumped back to the high altitude reservoir during off-peak times using excess power from the system. There are however few places geographically suitable for such a facility. These facilities are also expensive and relatively inefficient.

With the increase in the use of renewable resources to generate electrical energy, such as solar and wind power generation, control of power generation is becoming even less flexible, since the power generated by such facilities is dependent upon weather conditions. The ability to store electrical energy is therefore becoming increasingly desirable. Large scale solutions, such as very large battery banks, have been proposed. However these are expensive and space-hungry and cannot be connected at the most desirable point which is at the point of load for example in a domestic home.

The present invention provides an electrical energy storage device for a site comprising: an electrical connection arranged to detachably connect to an electrical power system on the site; an energy store having an input arranged selectively to charge the energy store from the electrical power system, and an output arranged selectively to discharge the energy store to the electrical power system; and a processor arranged to monitor at least one condition relating to the site, and to monitor at least one condition relating to the energy store, and to control the energy store to charge or to discharge dependent upon the monitored conditions. Preferably, the device comprises a communication interface for the processor.

Such a device could be provided in a domestic or commercial site, in particular a site having a generation capacity such as PV panels, in order for the energy consumer at the site to obtain an electrical energy supply more efficiently or more cheaply, and in order to smooth out fluctuations in energy supply and/or demand from the site.

The electrical connection may be a plug, such as a standard mains plug. The device may therefore be detachable, such that a user such as a domestic user can install, move or remove the system themselves simply by plugging in to a standard mains socket without incurring the cost of a qualified third party entering the property to wire the system into the household electrical system. Alternatively the device may be wired into the system, or may be connected via a custom socket.

The condition relating to the site may be a condition relating to power flow at the site, for example including one or more of the level of power being generated at the site, the level of power demand at the site, the time and/or date, the current tariff for purchasing power from the system, and the weather conditions (actual and/or predicted) at the site. The condition relating to the site may comprise an expected or known future condition at the site, such as likely power demand or generation or tariff. The condition relating to the energy store may include at least one of the energy store level, the voltage or temperature of the energy store, and the input or output current of the energy store. The conditions may be monitored continuously or periodically.

The processor may control the energy store to charge or discharge dependent upon whether each of the monitored condition(s) relating to the site and the monitored condition(s) relating to the energy store meet predetermined criteria.

Thus in a simple example the processor may be arranged to operate the energy store input to charge the energy store when power generated at the site exceeds power demand at the site, if the energy store is below a predetermined level of charge. The processor may also be arranged to operate the output of the energy store to discharge when power demand on the site exceeds power generated on the site, if the energy store is above a predetermined level of charge. The processor may also or alternatively be arranged to control the energy store input to charge at a time when the purchase price of power from the supply system is low, if the energy store is below a predetermined level of charge.

The electrical power system may be an electrical circuit on the site, which may be directly connected to a power distribution system. Thus the electrical power system may include one or more of: an electrical circuit on the site, a power distribution network, an electricity supply company, a transmission network operator, or other parties connected to the distribution system, including transmission system operators. Thus the power system on a site may comprise an electrical network at that site which may form part of a wider distribution system including the wider electricity grid outside that site. However in some cases the electrical power system on a site may be electrically isolated.

The monitored condition(s) relating to the site may include an instantaneous or expected deficit or surplus of power required by the power system. The deficit or surplus may be either a physical deficit or surplus, or a market traded deficit or surplus, or may be determined according to variations in AC frequency or voltage or power factor etc. from expected or required values, or rate of change of a power parameter such as frequency or voltage, etc. sensed on the site.

The processor may receive instructions via the communications interface. The processor may have a memory for storage of instructions, and may be pre-programmed with such instructions. The interface may be arranged to provide or modify the instructions. Thus a user may program the processor depending upon the user's requirements or site conditions.

Advantageously the processor may also be arranged to determine the charging rate in dependence upon the monitored conditions. For example, the processor may determine an optimum or most efficient charging rate in dependence upon the monitored conditions such as the charge level, the time available to charge, the power at which it is required to charge, the amount of energy required to be stored in a given time, or the actual or predicted weather or current or expected deficit or surplus of electricity in the distribution system.

The device may provide an advantage that the consumer may utilize at the site a higher proportion of the power generated at the site by storing generated energy for future use, and/or may store energy from the distribution system at a time when it can be purchased more cheaply for later use.

The energy store may comprise a battery, and the device may include an inverter for converting direct current from the energy store to alternating current for supply to the distribution system. The connection may be a mains power connection connected to a distribution system such as the national grid. The inverter may be a mains tied inverter. The device may be of a size which can easily be accommodated in a domestic setting. It has been found that, in an average domestic setting in the UK, for example where PV panels are fitted, the battery preferably has a capacity of around 2 to 4 kWh. The device may be provided as a small, safe and economical unit which can simply be plugged in to the mains supply for example in a home.

The device may also provide an advantage to the distribution system supplier by smoothing energy demand and hence reducing peak energy demand, since users of the system can effectively provide storage capacity which would otherwise need to be provided by the distribution system.

In one example, the processor may be arranged to receive instructions from the electrical power system (which may include generators, electricity suppliers, network operators, and other parties connected to the distribution system), and to control the energy store additionally or alternatively dependent upon such instructions. Thus the processor may be arranged to control the input to charge the energy store from the distribution system when there is excess capacity in the system, and to control the output to discharge the energy store to the system when there is excess demand in the system. Such instructions may therefore effectively be override instructions, although the processor may still take account of the monitored conditions as above, such as charge level of the energy store.

Thus in another aspect the invention comprises an energy management system comprising a plurality of devices as defined above, and a controller for providing instructions to the devices.

The invention also provides a method of energy management in a system, in which a plurality of devices according to the invention are connected to the system, comprising: monitoring power demand in the system, communicating an instruction to charge the energy store of at least one device connected to the system in the event that demand falls below a predetermined level, and communicating an instruction to discharge the energy store of at least one device in the event that demand exceeds a predetermined level.

Where the monitored condition relating to the site comprises power flow at the site, and in particular whether or not power demand at the site exceeds power generation at the site, the processor may be arranged to determine the direction of power flow at a power supply connection of the electrical power system. In order to do this, the current and voltage waveforms may be compared to determine a phase difference. A problem with this is that, whilst a current clamp can be used to measure the current waveform in a convenient location such as adjacent the electricity supply meter, a plug and socket will be required near the connection to the meter to measure the voltage waveform, which often will not be present near the electricity supply meter.

Thus according to another aspect the invention provides a method of determining the direction of power flow at a first location in an electrical power system (such as at or adjacent a power supply connection or the electricity supply meter) by determining a phase difference between current and voltage waveforms, in which the voltage waveform is detected or measured at a location remote from the location in which the current waveform is detected or measured.

Thus the invention provides a method of determining a phase difference between a current waveform and voltage waveform at a first location in an electrical power system, comprising: determining the current waveform at the first location at a first time point; determining the voltage waveform at a second remote location at a second time point; determining the time delay between the first time point and the second time point; synchronizing the waveforms using the time delay so as to determine a phase difference between the waveforms; and determining the direction of power flow dependent upon the phase difference.

For example, the time delay between the timepoints may be determined by sending a first timestamp signal from the first location to the second location, and sending a second timestamp signal from the second location to the first location, the second timestamp being indicative of the time at which the first signal was received at the second location, such that the time taken for a signal to travel between the two locations can be accurately determined.

Thus the voltage waveform may be measured remotely from the current clamp, possibly as part of the energy storage device, which may be located near a convenient socket. Since the time taken for signals to travel between the locations is known, the waveforms measured at the locations can be synchronized. It will be apparent that a large number of devices according to the invention connected to the distribution system could provide a significant storage facility to the system.

In order that the invention may be more readily understood, reference will now be made to the accompanying drawings, in which.

Figure 1:
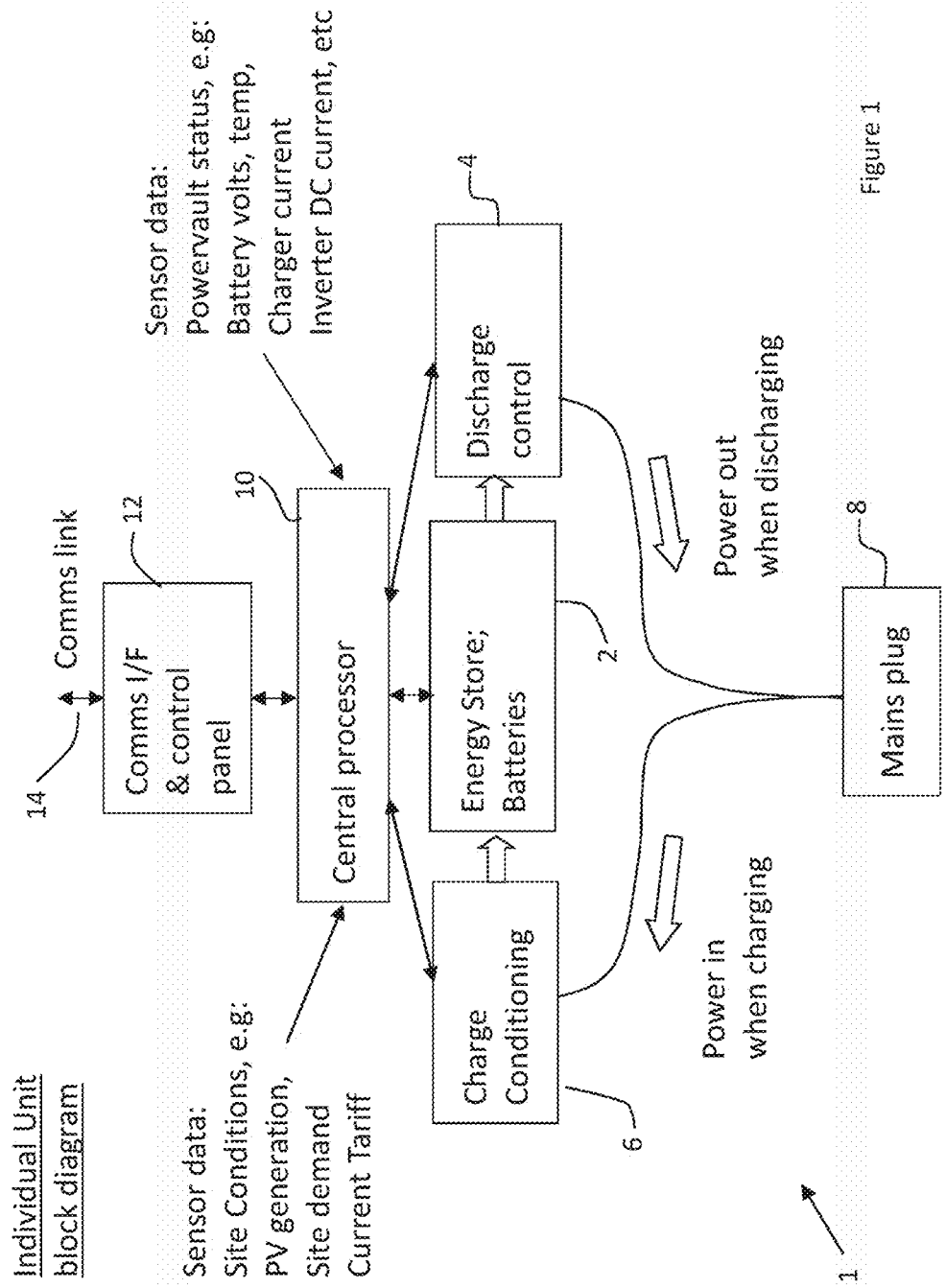
FIG. 1 is a block diagram of a device according to one aspect of the invention.

Referring to FIG. 1, the device comprises an energy store such as a battery 2, having an output comprising a discharge control 4 and an input comprising a charge conditioner 6. The device includes a connector for connecting the device to an electrical power system, such as a mains plug 8. The connector is coupled to the charge conditioner 6 and discharge control 4 in order to discharge battery power to the system or to charge the battery from the system as required.

A processor 10 is arranged to operate the charge conditioner 6 and discharge control 4, to monitor their operation, and to monitor the battery status. The processor also monitors sensor data relating to site conditions, such as PV generation, site demand, actual and predicted weather conditions, actual/predicted deficit or surplus of electricity in the distribution system and current energy tariff. The processor also monitors sensor data relating to the device status, such as the battery voltage, temperature, charger current, inverter current, etc. A communication interface 12 is connected to the processor such that the processor may provide details of the monitored conditions, and may receive instructions. The interface may for example include a control panel, and may be operated to provide or amend instructions to the processor IQ. The interface may further be connected to a communications link 14 such as a broadband link for the communication of data or instructions. The device may also have a default setting.

Figure 2:
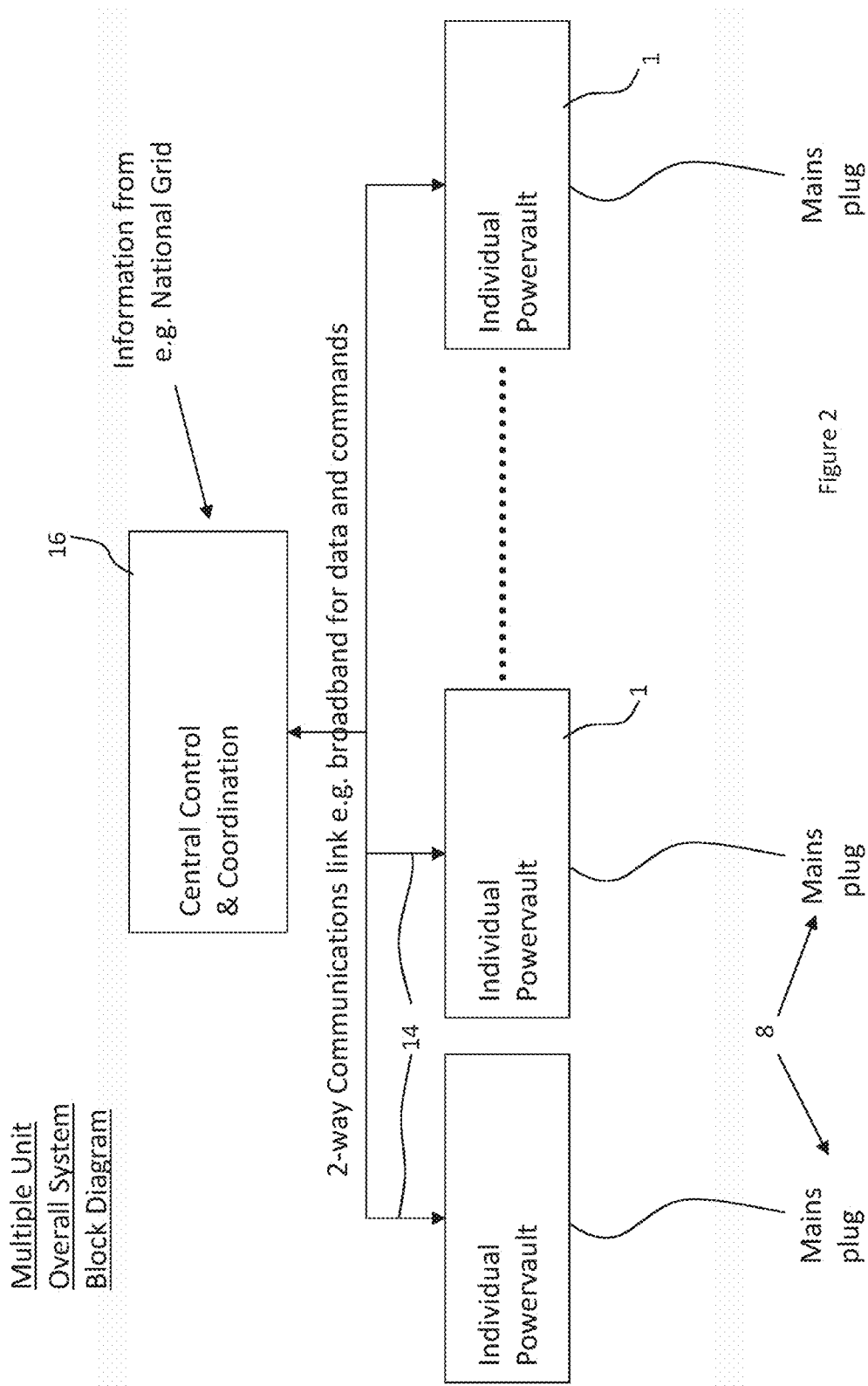
FIG. 2 is a block diagram of a system comprising a plurality of devices of FIG. 1.

Referring also to FIG. 2, a number of such devices 1 may be connected via their 2-way communications links 14 to a central control and coordination system 16. The control system 16 may receive information from the electricity distribution system such as the national grid in order to control the devices 1 either to charge or discharge to the grid (via the electrical power system) depending upon the grid conditions and upon the condition of each device 1.

In one example the device may comprise the following sensors: temperature, battery, inverter, controller, and site; battery voltage, current input, and current output; AC voltage, current input, current output and frequency; site power input and site power output. The data monitored may comprise communications status, battery status, charger status, site tariff (details in table), generation on site (detail in table), loads on site (detail in table), default site instructions if no communications are available.

Remote Power Sensing from the House (or Site) Incomer Current Sensor.

In one example the monitored condition relating to the site may be whether power is flowing into or out of the power system on the site (ie whether or not power demand exceeds power generation), which can be used to determine whether to charge the battery or discharge the battery.

Figure 6:
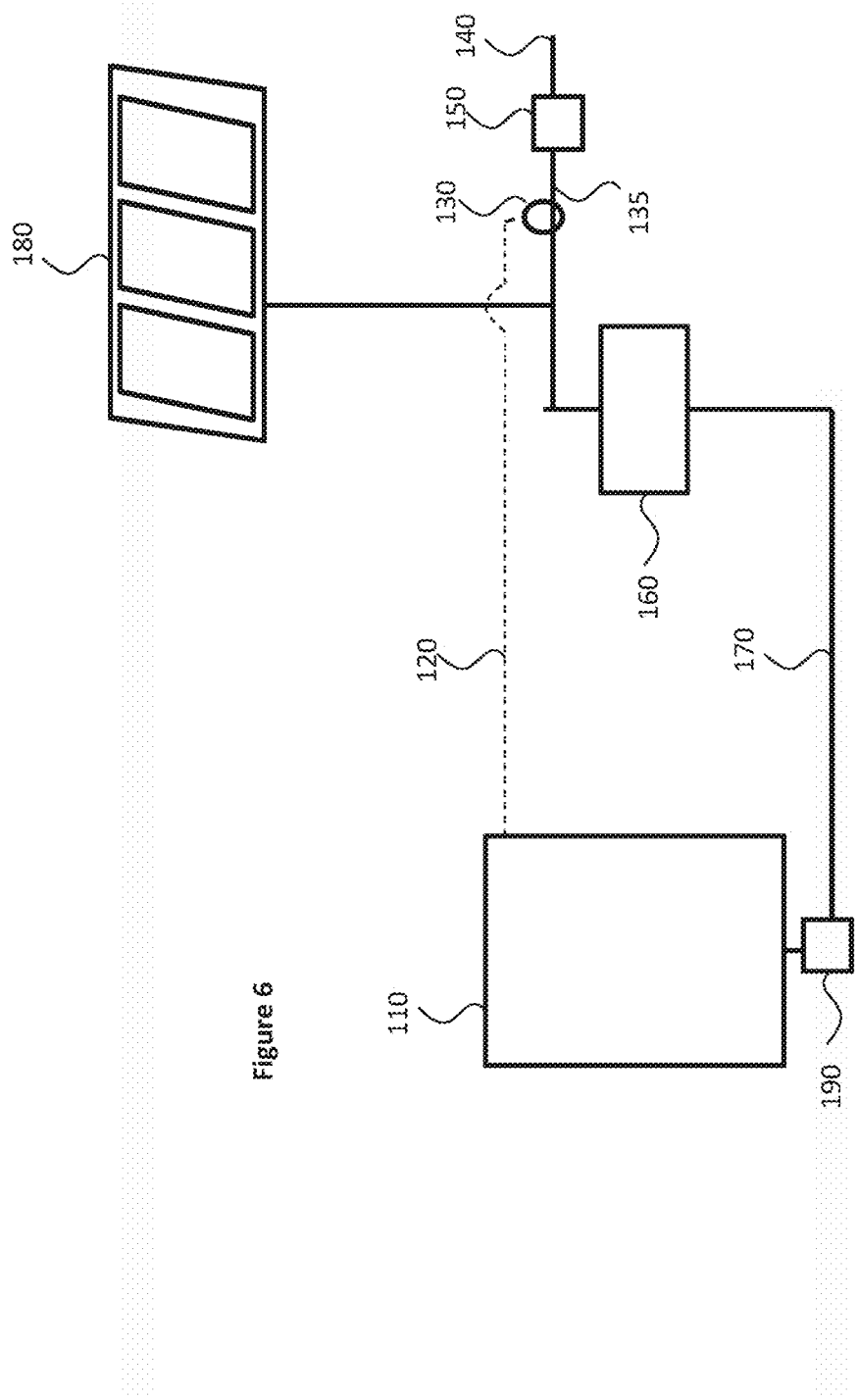
FIG. 6 is a diagram of a device according to the invention connected to an electrical power system on a site.

One method for achieving this is shown in FIG. 6 and comprises a wire 120 electrically connecting the energy storage device 110 to a current clamp 130. In practice the current clamp 130 could typically be connected near to the fuse box 160 or an electricity consumption meter 150 such as an energy supply meter, and between the connection of any micro generation 180 (such as PV panels) at the premises and the main connection of the premises to the external distribution power system 140.

Figure 7:
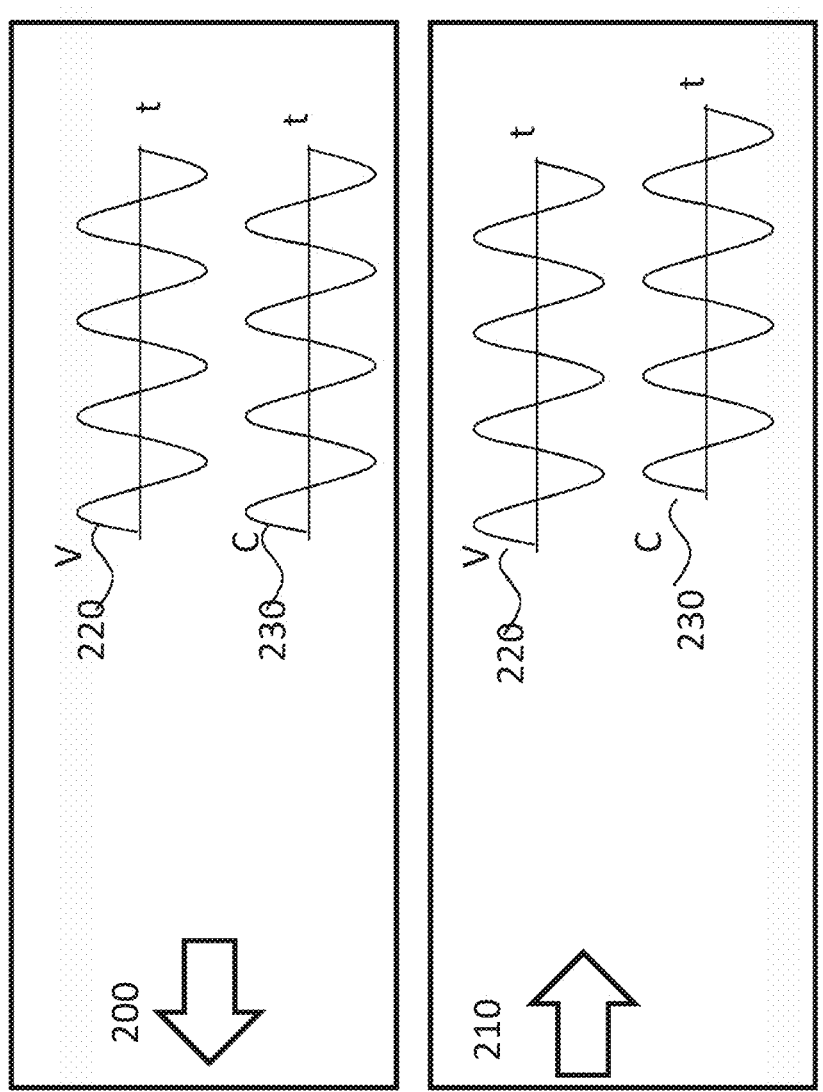
FIG. 7 shows exemplary graphs of current and voltage waveforms in the system of FIG. 6.

Referring to FIG. 7, determining whether power is flowing into or out of the premises may be accurately achieved by:

taking synchronised, high frequency measurements of the waveform of the AC current 230 measured by the current clamp and the waveform of the AC voltage 220 measured inside the energy storage device connected to a plug socket determining the phase difference between the current and voltage waveforms and hence direction of flow of electricity if the voltage and current are <±90° phase of each other then power is flowing in one direction 200. If the phase is >±90° different power is flowing in the opposite direction 210.

This method may be used for calculating the power flow into or out of the site (such as a house) and so to determine whether and how much to charge the electrical energy storage device, or whether to output power from it. This method may also be used to determine other characteristics of the electrical power flow such as the real power, the active power, the reactive power, the harmonics, power factor or any another electrical characteristic of the power flow in which the calculation is dependent upon the phase difference.

One problem with this method is that this necessitates an additional cable 120 to be connected from the energy storage device to a current clamp 130 around the "tail" 135 or "incomer" which connects to/from the meter 150. The cable 120 limits the number of physical locations in the house where the device can be installed since there must also be physical space and a power socket 190 nearby for connecting the energy storage device 110.

It may therefore be cheaper and/or more practical to take measurements of voltage and current in different places. For example:

current flowing into/out of the site may be measured simply by clipping a readily available battery-powered current transformer sensor unit onto the house incomer mains cable 135; it is not usually practical to measure voltage at this location because this would require a plug socket next to the meter which may not be present, and cannot be installed by the end user.

voltage within the electrical energy storage device may be measured simply and cheaply, but it may not be convenient to site the electrical energy storage device where the incoming current can be easily measured e.g. next to the meter 150.

The time at which the voltage and current in different places is sensed and compared should also be measured with high precision.

Monitoring whether power is flowing into or out of the premises may therefore be best achieved by sensing the voltage at the electrical energy storage device and sensing the current remotely for reasons of practicality and cost.

Figure 8:
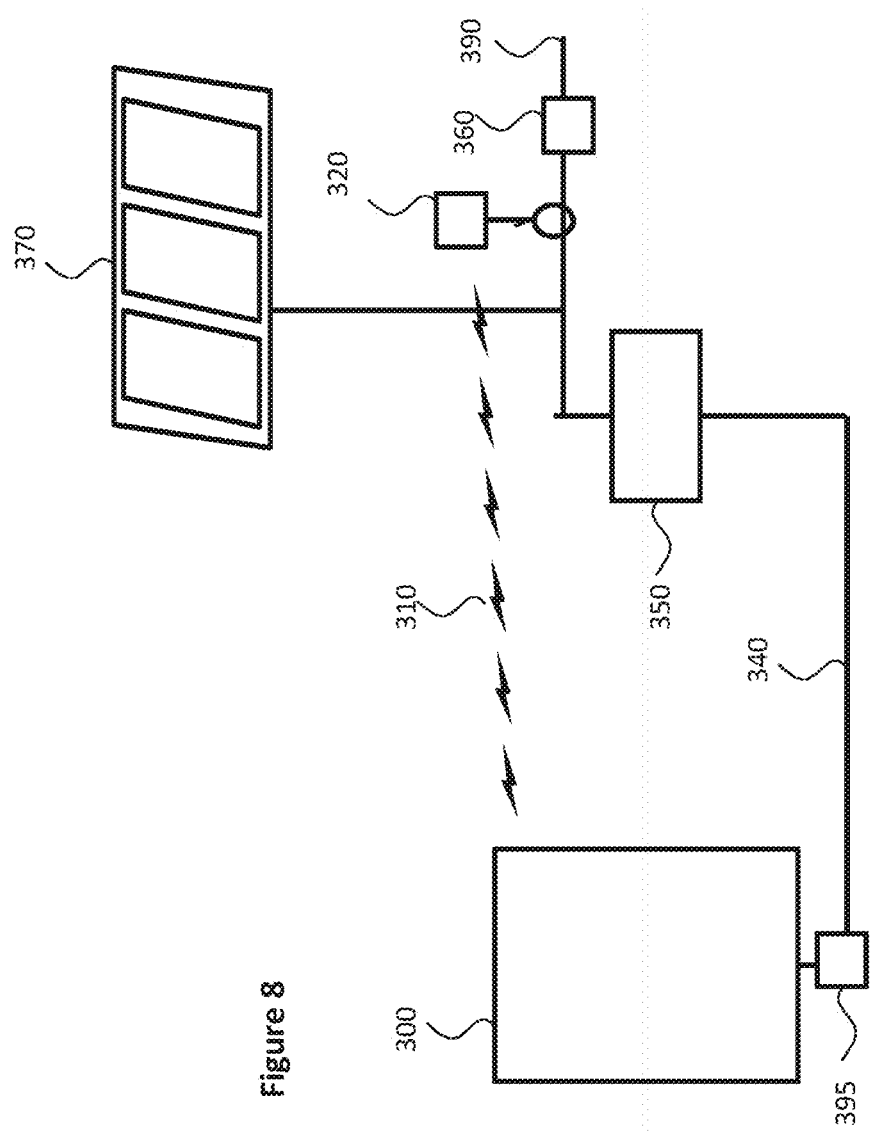
FIG. 8 is a diagram of a device according to the invention showing an alternative configuration.

Such a system is illustrated schematically in FIG. 8. An electrical energy storage device 300 communicates indirectly 310 (e.g. wirelessly or by electromagnetic induction onto the ring main 340 or via another network) with a remote current measurement unit 320. The remote current measurement unit 320 may be connected near to a fuse box 350 or an electricity supply meter 360, and downstream of an onsite generator 370 to determine total power being imported or exported.

There are a number of options for measuring the current at some distance from where the voltage is being read. Some exemplary options are set out below:

1. An extension cable 120 from the current sensor 130 to the electrical energy storage device 110 which will need calibrating on site. This may for example be up to 10 m long. See FIG. 6.

2. A combined current and voltage sensing unit can be provided separately from the electrical energy storage device which is also plugged into the mains supply. This remote unit measures current and voltage and then calculates the power into or out of the house and so whether to and how much to charge the batteries or output power from them using the inverter. This remote unit is then also connected via a data cable or powerline communications or a radio or wife or Bluetooth connection or infrared data link to transmit the data about the power into or out of the house to the electrical energy storage device. This may be suitable in situations where a plug socket is available next to the meter, and may alleviate to some extent the need for space next to the meter.

3. Multiple current clamps might be placed on multiple wires in the house to attempt to estimate the power consumed by various house loads and generation sources. However current clamps cannot accurately measure power consumption without reference to voltage, which is important particularly at low power levels to determine how much power is being drawn and in which direction it is flowing (into or out of the house). This requires multiple clamps, adding to inconvenience and cost. It may not be possible to clamp all the required loads/generation sources.

Figure 9:
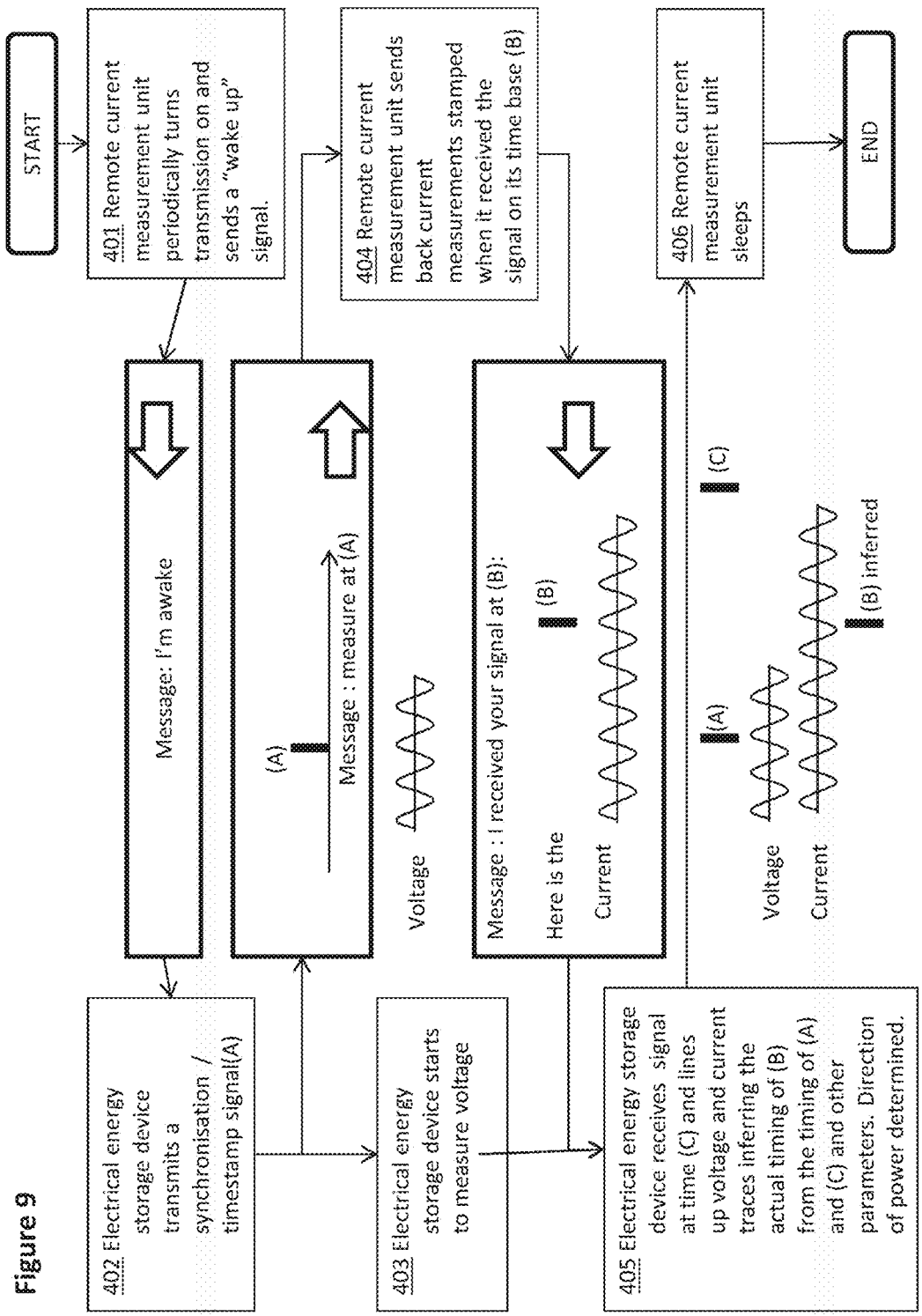
FIG. 9 is a flow diagram of a process for measuring a phase difference according to the invention.

Referring to FIGS. 7 to 9: In one embodiment a system for directional power sensing is created wherein:

a. The remote current measurement unit 320 may comprise a current clamp with a self powered processor preferably powered using a non-mains power source (e.g. using a USB connection or batteries or solar panels or similar or a combination) and connecting indirectly 310 to the electrical energy storage device 300.

b. The remote current measurement unit 320 measures current at a speed adequate to determine the phase of the current (e.g. about every 1 mS or faster) and may also have an inbuilt clock which may be real-time which is also measuring at the same speed (about 1 mS or faster).

c. The remote current measurement unit 320 can synchronise its readings without high power consumption, for example, by a signal being emitted by the electrical energy storage device which permits time synchronisation of the remote unit and the electrical energy storage device 401, 402,404,405. The remote current measurement unit 320 may request this signal 401 when it 'wakes up' and is ready to send data to keep its power consumption low.

d. The remote unit 320 will have means for communicating 310 with the energy storage device 300 for example a data cable or a radio or wife or
Bluetooth connection or powerline carrier method 310 to transmit or receive the current data and messages to or from the electrical energy storage device.

e. The remote unit can receive a time signal or synchronisation trigger or a request for the current measurement from the electrical energy storage device 402, 404.

f. The remote current monitoring unit 310 can send the measured current data and may send other messages such as its time and data on the difference in the time on its own clock and that of the electrical energy storage device back to the electrical energy storage device 404.

g. The electrical energy storage device measures the voltage waveform at a rate adequate to determine the phase (e.g. roughly every 1 mS or faster)402 then may receive from the current sensor the measured current data and other messages such as the time at the current sensor and data on the difference in the time on its own clock and that of the current sensor and also calculates the time delay or latency of the data from the remote current measuring unit 404 and so can use this to calculate the phase difference between the current and voltage as if the two units were physically connected 200, 210.

h. This allows it to determine the power into or out of the house and so whether to and how much to charge the batteries or output power from them using the inverter.

Alternative approaches may seek to re-create a virtual voltage channel, requiring considerable equipment, which consumes too much power for long term remote monitoring and takes up physical space. Embodiments of the present system can enable the direction of power to be remotely sensed accurately, using a method where current is remotely sensed and power consumption and physical dimensions of the remote sensor are small. Benefits can therefore include lower power consumption, lower space requirements near current sensing location and not needing a power socket next to the location of the remote current sensor which do not occur with voltage channel virtualisation.

It is noted that embodiments are quite different to simple "current clamps" systems which may be remote but which cannot be used to measure the direction of power because they do not measure voltage, do not measure current on an accurate timebase, are not synchronised accurately, do not measure phase difference between voltage and current waveforms and are not paired with accurate voltage sensing, and may not have the battery life improvements and small size noted.

Weather Look-Ahead

The monitored condition relating to the site may be a future or expected condition.

The future condition may comprise expected weather conditions and/or a present or future surplus or deficit of electricity requirement on the distribution network.

The control system may look ahead to tomorrow's and a few days ahead weather and especially cloud cover and sunshine levels. It will then use this information as another parameter to determine the level of energy input or charge to the batteries or energy output or discharge from the batteries through the inverter to the site or house. This may be particularly use for a house with photovoltaic panels but may also be useful for determining the likely electrical load (for example, heating or lighting requirements) of the house over similar time periods. Similar requirements may exist in commercial settings.

For example on a day when tomorrow's weather forecast is expected to be sunny and bright then it will allow a higher level of energy output from the batteries so they may reach a lower voltage level. This is because tomorrow it will be able to charge the batteries rapidly and up to full voltage again which is good for battery life.

On a day when tomorrow is expected to be dull and especially if the following days are also expected to be dull then it will not permit as much energy to be output and so will maintain the batteries at a higher voltage. This is because tomorrow the batteries will have to remain at a low voltage as it may not be possible to charge them much if at all which is bad for battery life.

This is to protect the life of the batteries by not letting them sit at a low voltage for long periods whilst also making sure the energy from the photovoltaic panels is used to charge the batteries, which is economically advantageous.

For a house connected to a wind turbine the control system may look ahead to tomorrow's and a few days ahead weather and especially the wind conditions in a similar manner for the same reason.

Similarly, for a house connected to a hydro-electric turbine the control system may look ahead to tomorrow's and a few days ahead weather and especially the rain fall conditions for the same reason.

The weather may be fed into an algorithm to predict the likely demand or supply of electricity into the distribution network and which may be transmitted. A signal of the expected future deficit or surplus of electricity may be used in the same way.

Figure 3:
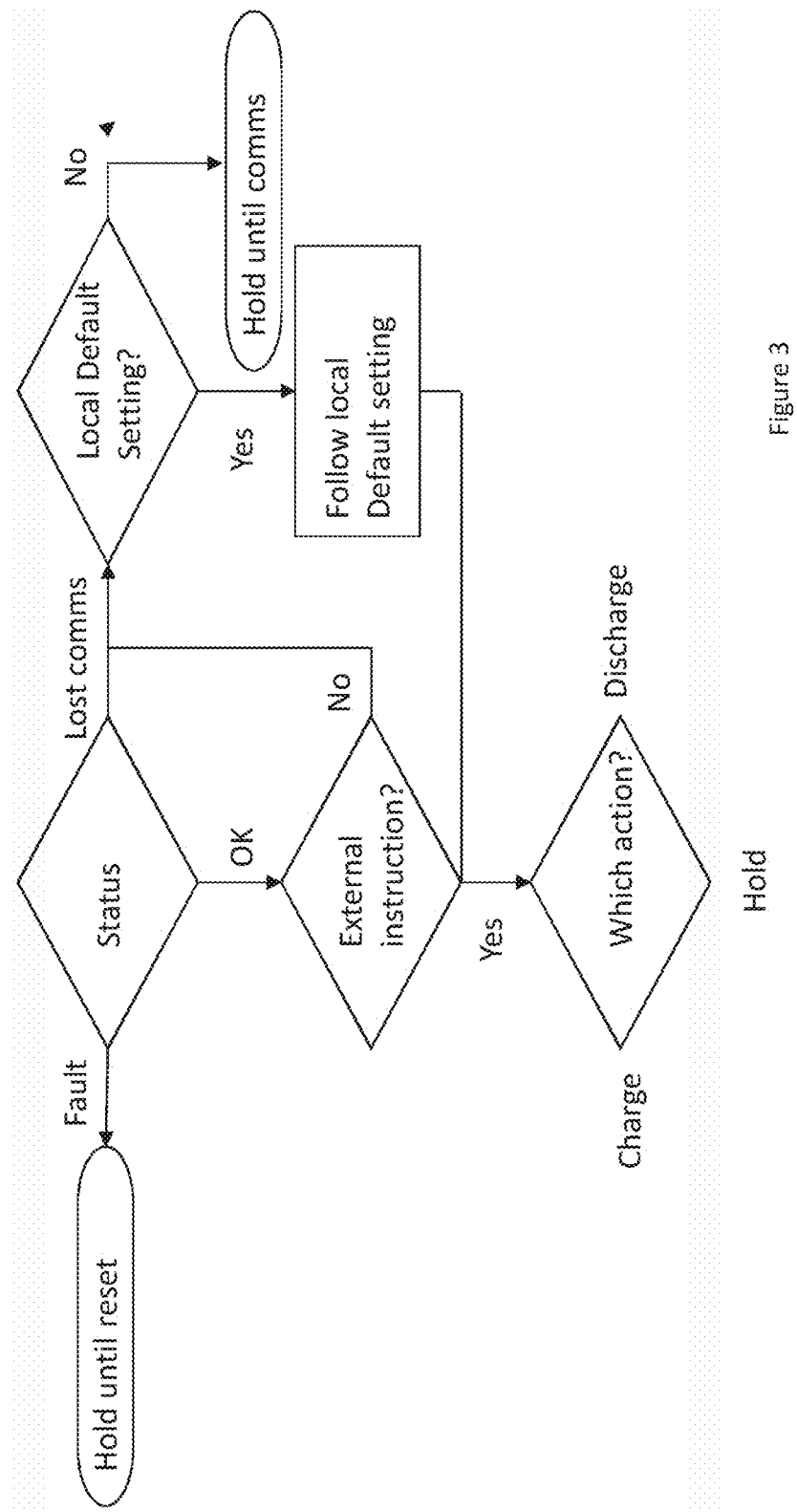
FIG. 3 is a flow chart showing control of the device of FIG. 1.

Use of the device will now be further described. Example look up tables are provided in the accompanying annex. With reference to FIG. 3, if communications are live, then the unit relies on the control signal from the remote server. This signal will be one of four specific instructions;
1. charge
2. deliver power
3. hold
4. use site defaults.

A time-clock is always running as this may trigger an operation of the charger or inverter if this is part of the control strategy in play at any given time. When a control signal, default setting demands and/or a certain time is reached, the main control chart will result in a change of status. This will trigger some action in any of the next three parts of the flow chart as recorded in the table: The central control algorithm will look the range of inputs and choose which actions to take. The status is continuously monitored and data held in a store. Parameters are shown in the attached tables.

Charge Control

Figure 4:
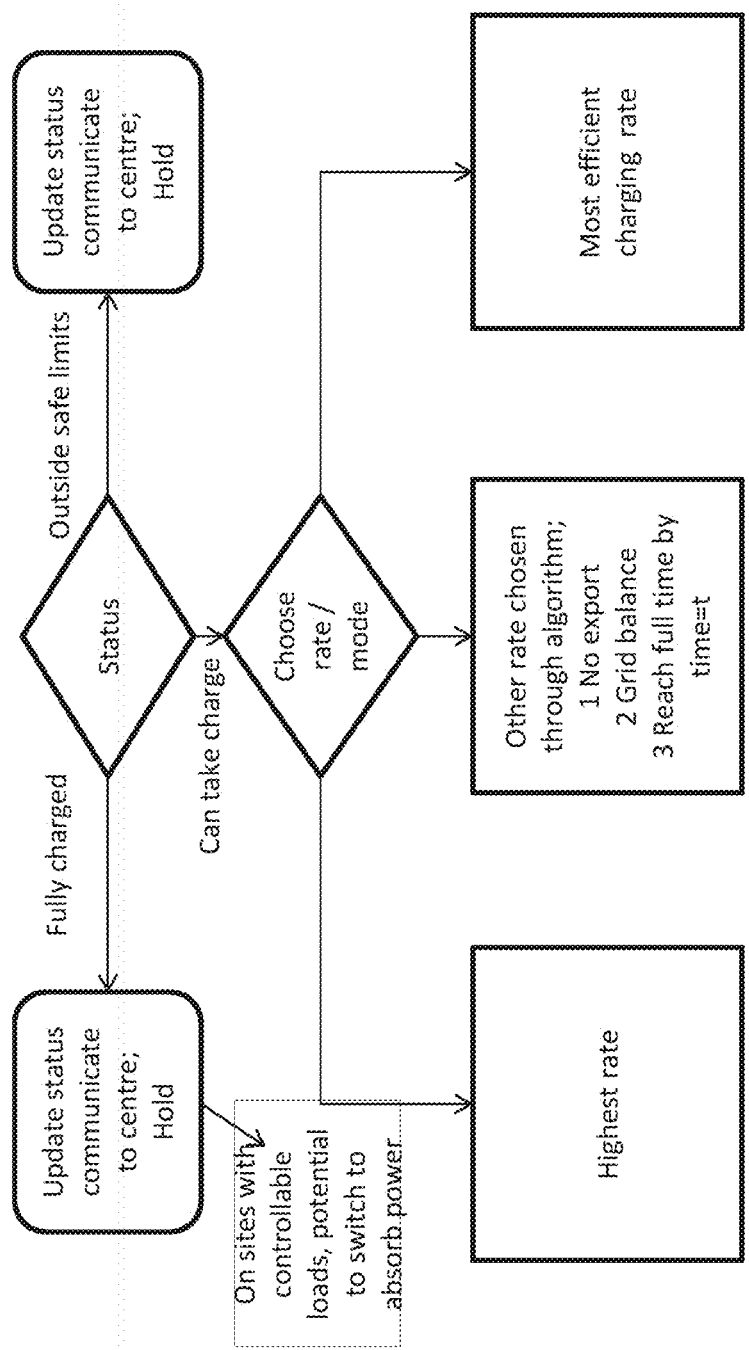
FIG. 4 is a flow chart showing charge control of the device.

Referring to FIG. 4, if the central control algorithm chooses to charge then this part of the control system (sub-routine/process) runs. The central control will send other parameters such as time available to charge, power desired to charge at or energy to store in a given time (or it will say that it can be chosen by the charge controller):

Firstly the controller examines battery volts and temperature and compares them with a look-up table to determine the state of charge as a percentage of fully charged (and check against safe limits). A long-term record will be held in memory too. If the battery is fully charged no action is taken and the main controller is updated and informs the central server (which may be in 'the cloud').

If the battery can take more charge, then the main controller instruction is followed. If the instruction is that the rate can be chosen by charge control, then a calculation is performed to work out what would be the most efficient charge rate and this is used.

If central control sent a requested 'power desired to charge' then in future versions this may alter periodically, for example in time scales from seconds to weeks. Charging continues until the battery is full, temperature limit is exceeded, a fault exists, or central control sends a different request. So for example:

First check status of battery: what is percentage charged? (use look-up table earlier) If less than 95% then charge. Use look-up table as earlier until battery volts at battery temperature=100% charged. Use look-up table for charging.

Rate of charge DC Amps to be selected as either:
1. Most efficient (use charger & Battery look-up tables, e.g. as attached); end result probably 4 to 6 Amps for our current system.
2. Completely charge the battery in the time available; use 'most efficient' if time allows; calculate time x most efficient current (Amps)×48 (volts)=y kWh. Then compare y with kWh capacity of system and then with percent of charge. Use higher current than 'most efficient' if not enough time for 'most efficient'.
3. Draw x watts from grid as per instruction from central server; send appropriate control signal value to charger to meet demanded value of charge power from grid.
4. Avoid export if there is onsite generation. Use site data; Grid Current I to/from site to determine if site is exporting. If so find value of export power. Send appropriate control signal value to charger to charge at value of 'export—50 W'. Keep monitoring and alter if necessary every minute.

Power Delivery Control

Figure 5:
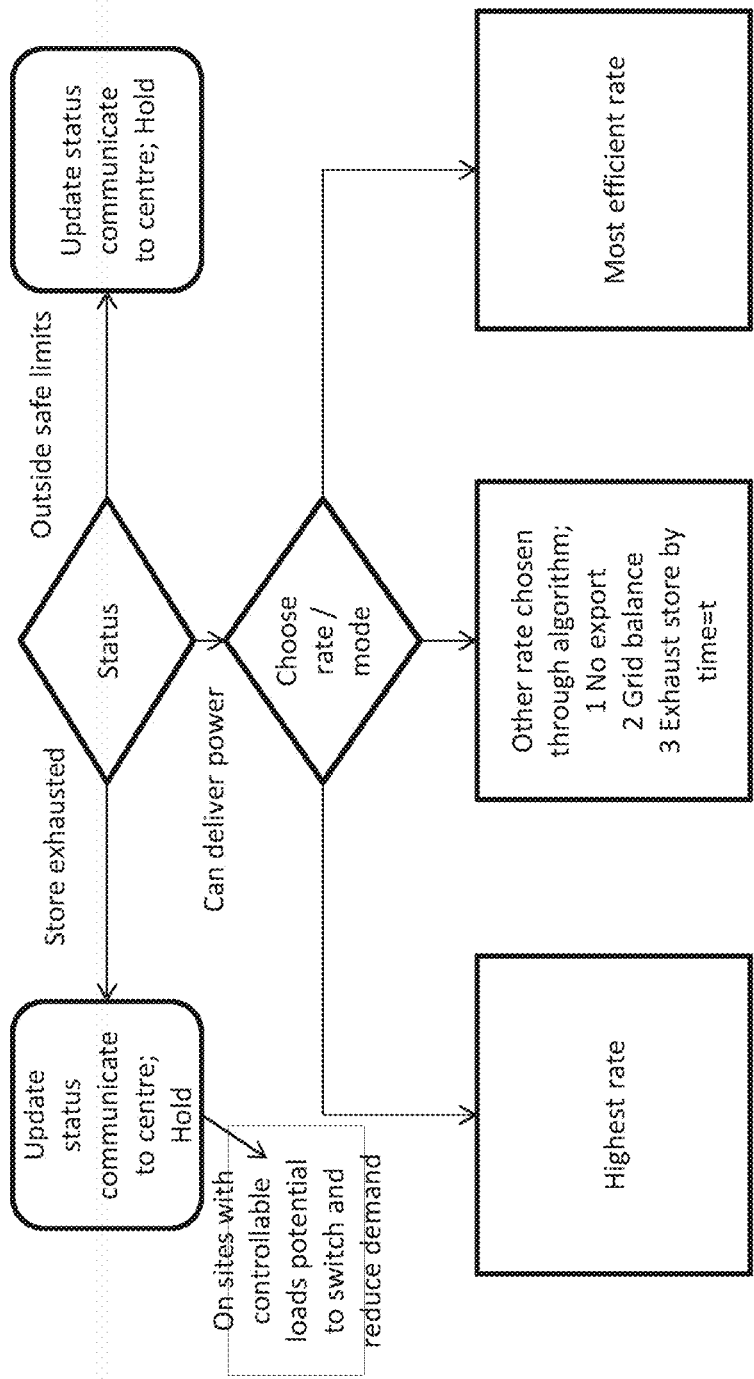
FIG. 5 is a flow chart showing power delivery control of the device.

Referring to FIG. 5, if main control chooses to deliver power to the grid then this part (sub-routine/process) runs. The main control will send other parameters such as time available to deliver power, power desired to deliver at or energy to deliver in a given time (or it will say that it can be chosen by power delivery control):

Firstly the controller measures battery volts and temperature and compares with a look-up table to determine the state of charge as a percentage of fully charged (and check against safe limits). A long-term record will be held in memory too. If the battery is exhausted no action is taken.

If the battery can deliver power, then the main controller instruction is followed. If the instruction is that the rate can be chosen by power delivery control, then a calculation is performed to work out what would be the most efficient power delivery rate and this is used. If central control sent a requested power delivery then in future versions this may alter every minute. Power delivery continues until the battery is exhausted or a low-volts level reached, temperature is exceeded, a fault exists, or main control sends a different request.

Therefore: First check status of battery: what is percentage charged? (use look-up table earlier) If more than 40% then deliver power. Use look-up table as earlier until battery volts at battery temperature=0% charged, i.e. exhausted. Use look-up table for discharging.

Rate of charge DC Amps to be selected as either:
1. Most efficient (use inverter & Battery look-up tables, e.g. as attached); end result probably 300 W a.c. from inverter for our current system.
2. Completely exhaust the battery in the time available; use 'most efficient' if time allows; Calculate time x most efficient current (Amps)×48 (volts)=y kWh. Then compare y with kWh capacity of system and then with percent of charge.

Use higher current to deliver (up to max from inverter) than 'most efficient' if not enough time for 'most efficient'.
3. Deliver x watts from grid as per instruction from central server; send appropriate control signal value to inverter to satisfy demanded value of power to deliver to grid.
4. Avoid import. Use site data; Grid Current I to/from site to determine if site is importing. If so find value of import power. Send appropriate control signal value to inverter to deliver at value of 'import—50 W'. Keep monitoring and alter if necessary every minute.

Central Control Algorithm

Examples are:

PHOTOVOLTAIC SITE (Or Other On-Site Generation): Use data on the time of day, output of the PV system, weather signal (is it or will it be sunny today, tomorrow, the next day, etc), power flow into or out of site, 'typical' conditions at site 'on a day like today' (maybe some expert learning system for this eventually, but perhaps weekday/weekend for now).

The calculation is; is power being exported from the site now (i.e. is generation from the PV more than being used on site)? If so, charge the system. To avoid rapid load changes and/or switching on and off too frequently, this maybe smoothed, rather than an instantaneous value. If the system has some learning, then it may choose to stop charging over, e.g. lunch-time, and resume afterwards.

ECONOMY 7 SITE (this has a cheap electricity tariff from 00:30 hours to 07:30 hours in the UK). The calculation is; if time >00:30 hours and <07:30 hrs, charge the system.

COMPLEX TARIFF SITE: This part of the algorithm will compare usage on the site over a typical day with the tariff and calculate if it is cheaper to charge 'now' or deliver power 'now' than do nothing.

REMOTE CONTROL SITE: This relies on a remote signal from a central control server to determine if it is economic to charge or deliver power. If so, act accordingly. Typical reasons for actions would be:

Grid Stability: Need to draw power from the grid, need to deliver power to the grid.

Energy Store: Grid scale renewables available: charge using this now. Insufficient generation on line: deliver power from store.

Economic enhancement: Power price arbitrage; according to a centrally controlled decision within a company power trading team.

Figure 10:
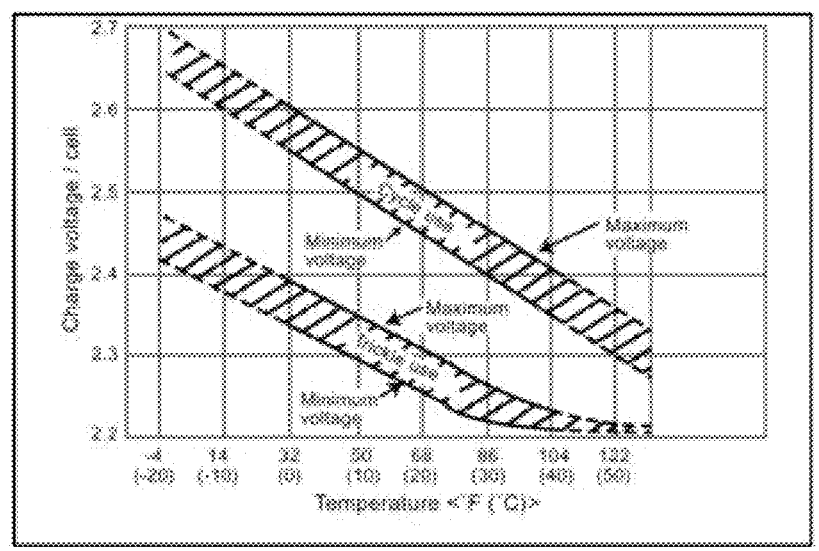
FIG. 10 is a chart showing a relationship between charge voltage and temperature.

Referring to FIG. 10, a relationship between charge voltage and temperature is shown.

Figure 11:
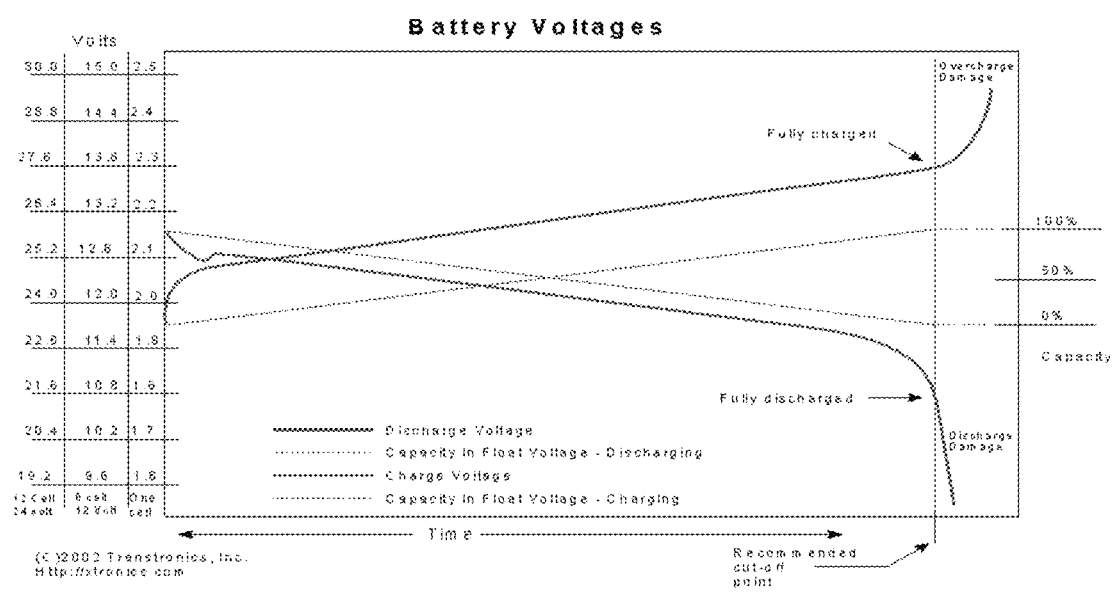
FIG. 11 is a chart showing a relationship between battery voltage and time.

Referring to FIG. 11, a relationship between battery voltage and time is shown.

Figure 12:
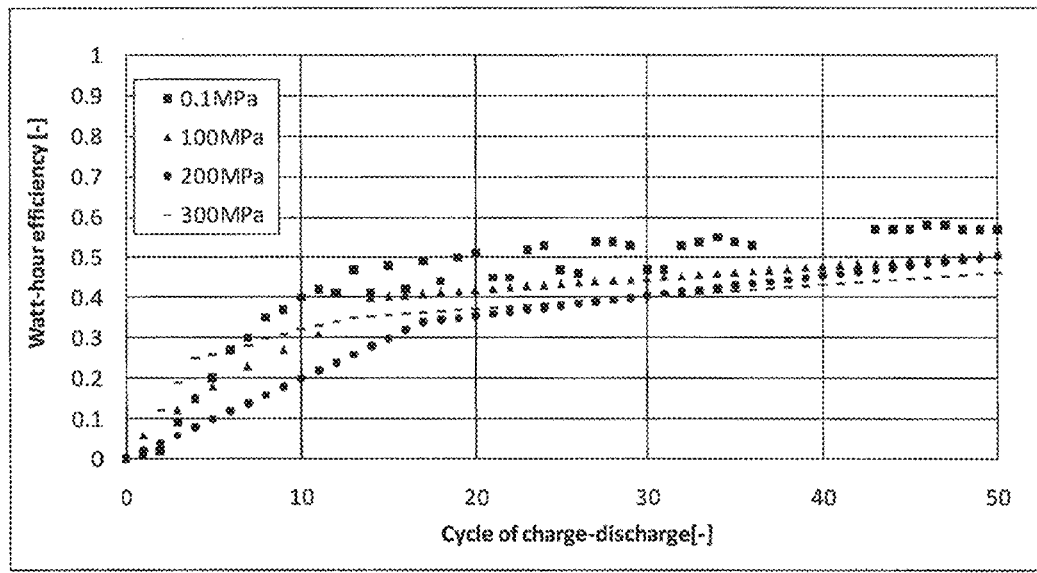
FIG. 12 is a chart showing a relationship between Watt-hour efficiency and cycle of charge-discharge.

Referring to FIG. 12, a relationship between Watt-hour efficiency and cycle of charge-discharge is shown.

Figure 13:
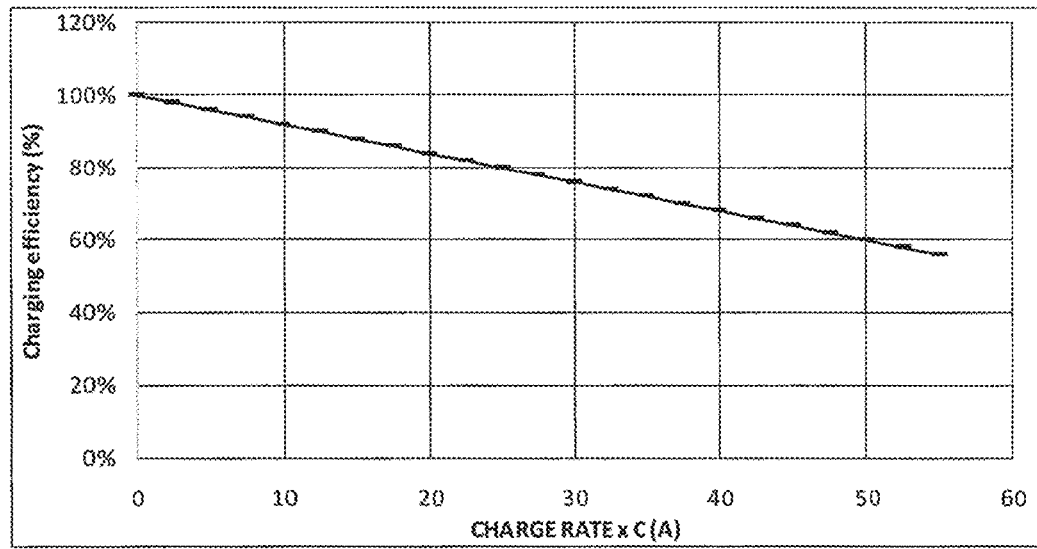
FIG. 13 is a chart showing a relationship between charging efficiency and charge rate.

Referring to FIG. 13, a relationship between charging efficiency and charge rate is shown.

Figure 14:
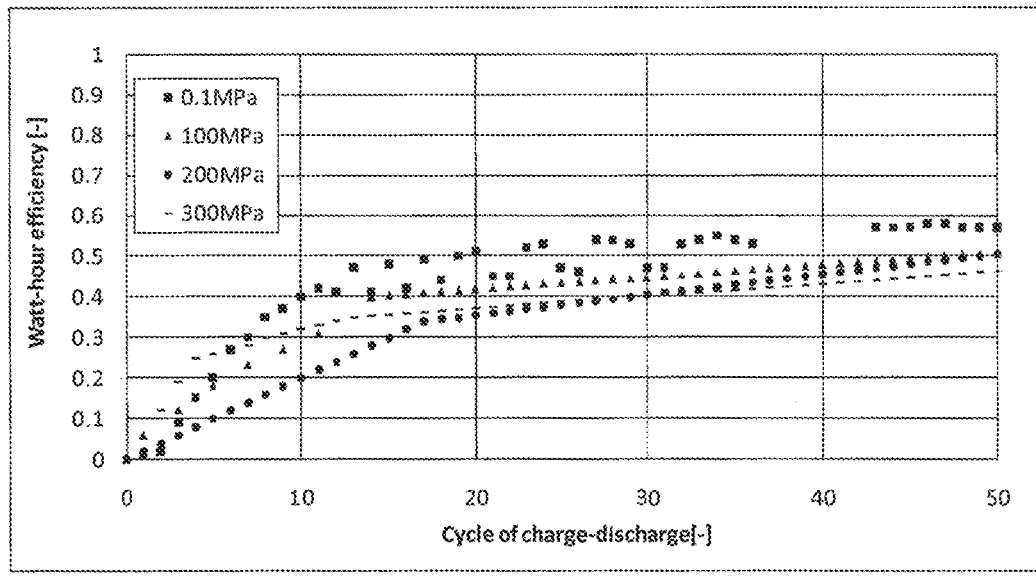
FIG. 14 is a chart showing a relationship between Watt-hour efficiency and cycle of charge-discharge.

Referring to FIG. 14, a relationship between Watt-hour efficiency and cycle of charge-discharge is shown.

Figure 15:
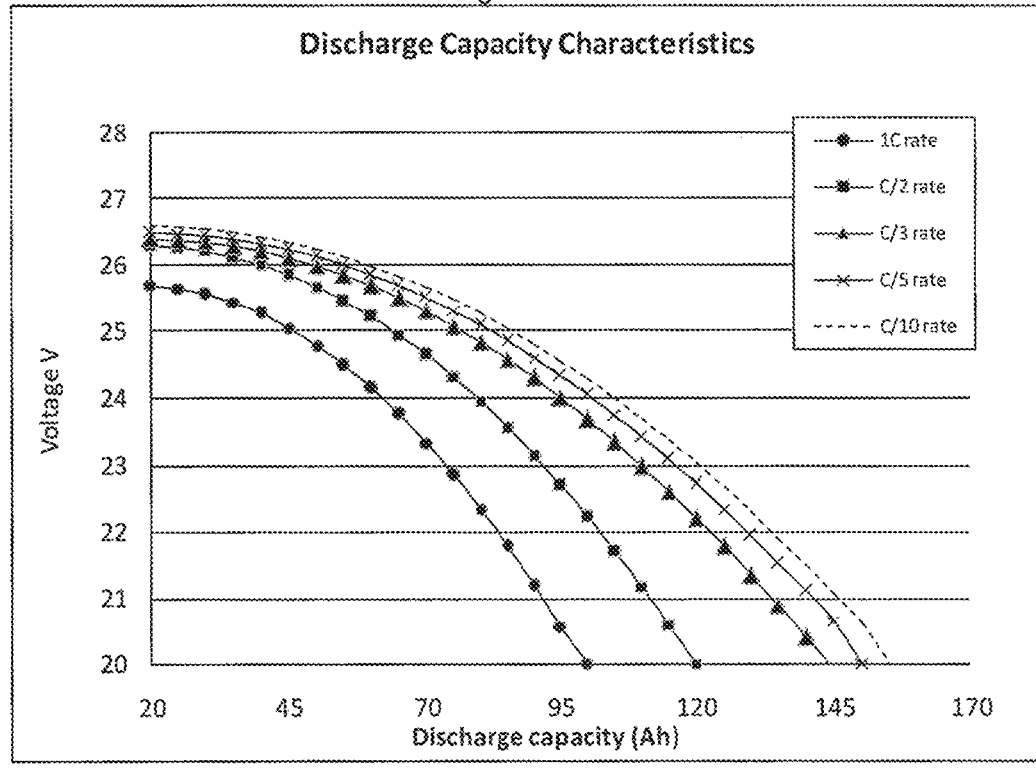
FIG. 15 is a chart showing a relationship between voltage and discharge capacity.

Referring to FIG. 15, a relationship between voltage and discharge capacity is shown.

Annex

Main Control Flow Chart

The status is continuously monitored and data held in a store. Parameters are:

Battery Status

| Parameter | Units | Range | Precision | Within Limits |
| --- | --- | --- | --- | --- |
| Temperature T | Centigrade | −20 to +200 | 0.01 | −2 to +50 |
| Delta T | Centigrade per second | −1 to +1 | 0.01 | −.01 to +.5 We may need to adjust these with experience. High upward range likely to be a fault |
| Voltage V | Volts | −10 to +100 | 0.01 | 40 to 60 |
| Delta V | Volts per second | −50 to +50 | 0.01 | +/5 Large, brief excursions probably due to switching. |
| Current I | Amps | −100 to +100 | 0.001 | +/−10 |
| Delta I | Amps per second | −500 to +500 | 0.01 | −50 to +50 Large, brief excursions probably due to switching. |
| Number of partial (or full) cycles completed | Integer number | 0 to 5000 | 1 | Any charge or discharge operation of more than 0 1 kWh is counted |
| Number of full cycles completed | Integer number | 0 to 5000 | 1 | Any charge or discharge operation of more than 1 kWh is counted |

Flags

| Flag | Values | | |
| --- | --- | --- | --- |
| Battery Status | Normal = 0 | One or more parameters out of limits = 1 | Fault = 2 |

| Look-up | Inputs | | Output | Precision |
| --- | --- | --- | --- | --- |
| State of charge | Voltage | Temperature | Percent fully charged | 0.01 |

A chart like FIGS. 10 and 11 needs to be stored as a look-up table (trickle use for 6-cell battery, giving 1.9v to 2.33v per cell at 18c off-load):

| Calculations | Inputs | | | Output | Precision |
| --- | --- | --- | --- | --- | --- |
| Expected state of charge | Time since last full charge. Timestamp | Energy drawn; power drawn in each second integrated. kWh | Battery capacity kWh | Percent | 0.01 |

-continued

| Calculations | Inputs | | Output | Precision |
|---|---|---|---|---|
| Time to fully charged | Known state of charge % | Rate of charging Watts | Battery capacity kWh | Seconds | 0.01 |
| Time to exhausted | Known state of charge % | Rate of discharging Watts | Battery capacity kWh | Seconds | 0.01 |
| Time to temperature out of limits | Temperature, centigrade | Delta T | Limits high and low Centigrade | Seconds | 0.01 |
| Time to voltage out of limits | Voltage Volts | Delta V | Limits high and low volts | Seconds | 0.01 |

Charger Status

| Parameter | Units | Range | Precision | Within Limits |
|---|---|---|---|---|
| Temperature T | Centigrade | −20 to +200 | 0.01 | −2 to +60 |
| Delta T | Centigrade per second | −1 to +1 | 0.01 | −.01 to +.5 We may need to adjust these with experience. High upward range likely to be a fault |
| Voltage V | Volts | −1 to +100 | 0.01 | 40 to 60 |
| Delta V | Volts per second | −50 to +50 | 0.01 | +/5 Large, brief excursions probably due to switching. |
| Current I | Amps | −100 to +100 | 0.001 | −1 to +10 |
| Delta I | Amps per second | −500 to +500 | 0.01 | −50 to +50 Large, brief excursions probably due to switching. |

Flags

| Flag | Values | | | |
|---|---|---|---|---|
| Charger Status | Normal = 0 | One or more parameters out of limits = 1 | Fault = 2 | |

| Look-up | Inputs | | Output | Precision |
|---|---|---|---|---|
| Point on efficiency curve | Voltage | Current | Percent efficiency | 0.01 |

| Calculations | Inputs | | Output | Precision |
|---|---|---|---|---|
| Volts percent of rated | Volts | Rated max volts | Percent | 0.01 |
| Amps percent of rated | amps | Rated max amps | percent | 0.01 |
| Time to voltage out of limits | Volts | Delta V | Rated volts | Seconds | 0.01 |
| Time to current out of limits | Amps | Delta I | rated amps | Seconds | 0.01 |
| Time to temperature out of limits | Temperature, centigrade | Delta T | Limits high and low Centigrade | Seconds | 0.01 |

Inverter Status

| Parameter | Units | Range | Precision | Within Limits |
|---|---|---|---|---|
| Temperature T | Centigrade | −20 to +200 | 0.01 | −2 to +60 |
| Delta T | Centigrade per second | −1 to +1 | 0.01 | −.01 to +.5 We may need to adjust these with experience. High upward range likely to be a fault |
| DC Voltage V | Volts | −1 to +100 | 0.01 | 40 to 60 |
| Delta DC V | Volts per second | −50 to +50 | 0.01 | +/5 Large, brief excursions probably due to switching. |
| DC Current I | Amps | −100 to +100 | 0.001 | −1 to +10 |
| Delta DC I | Amps per second | −500 to +500 | 0.01 | −50 to +50 Large, brief excursions probably due to switching. |

-continued

| Parameter | Units | Range | Precision | Within Limits |
|---|---|---|---|---|
| Grid voltage | volts | 0 to 500 | 0.01 | 207 to 253. Large, brief excursions probably due to switching. |
| Grid Current I | Amps | −1 to +10 | 0.001 | 0 to +3. Large, brief excursions probably due to switching. |
| Grid Delta I | Amps per second | −500 to +500 | 0.01 | −1 to +1 Large, brief excursions probably due to switching. |

Flags

| Flag | Values | | | |
|---|---|---|---|---|
| Inverter Status | Grid-tied = 0 | One or more parameters out of limits = 1 | Fault = 2 | Waiting for grid = 3 | DC volts below limits = 4 |

| Look-up | Inputs | | Output | Precision |
|---|---|---|---|---|
| Point on efficiency curve | Voltage | Current | Percent efficiency | 0.01 |

| Calculations | Inputs | | Output | Precision |
|---|---|---|---|---|
| DC Volts percent of rated | Volts | Rated max volts | n/a Percent | 0.01 |
| DC Amps percent of rated | amps | Rated max amps | n/a percent | 0.01 |
| Time to DC voltage out of limits | Volts | Delta V | Rated volts Seconds | 0.01 |
| Time to DC current out of limits | Amps | Delta I | rated amps Seconds | 0.01 |
| Time to temperature out of limits | Temperature, centigrade | Delta T | Limits high and low Centigrade Seconds | 0.01 |
| AC Volts percent of rated | Volts | Rated max volts | n/a Percent | 0.01 |
| AC Amps percent of rated | amps | Rated max amps | n/a percent | 0.01 |
| Time to AC voltage out of limits | Volts | Delta V | Rated volts Seconds | 0.01 |
| Time to AC current out of limits | Amps | Delta I | rated amps Seconds | 0.01 |

Site Status

| Parameter | Units | Range | Precision | Within Limits |
|---|---|---|---|---|
| Internal Temperature T | Centigrade | −20 to +200 | 0.01 | −0 to +60 |
| External Temperature T | Centigrade | −20 to +200 | 0.01 | −10 to +30 (UK) |
| Delta T | Centigrade per second | −1 to +1 | 0.01 | −.01 to +.5 We may need to adjust these with experience. High upward range likely to be a fault |
| Grid Current I to/from site. +ve value means importing | Amps | −100 to +100 | 0.001 | 0 to +3. Large, brief excursions probably due to switching. |
| For each time period expected percentage energy available to store (e.g. from solar PV/microgeneration output based on predicted weather) | % | 0 to 100 | 1 | 0 to 100 |

-continued

| Parameter | Units | Range | Precision | Within Limits |
|---|---|---|---|---|
| For each time period expected kWh requirement to discharge (e.g. based on distribution system deficit/surplus) | kWh | 0 to 100 | 1 | 0 to 100 |

Flags

| Flag | Values | | | | |
|---|---|---|---|---|---|
| Site Status | Normal = 0 | One or more parameters out of limits = 1 | Fault = 2 | Export to grid = 3 | Import from grid = 4 |
| System manual settings | Normal = 0 | Holiday = 1 | Maintenance = 2 | Manual off = 3 | |
| Site has micro-generation | None = 0 | PV = 1 | Hydro = 2 | Wind = 3 | Other = 4 |
| Controllable loads at site? | None = 0 | Yes = 1 | | | |

| Look-up | | | Description | Precision |
|---|---|---|---|---|
| Micro-generation parameters | Peak kW output | | e.g. South facing PV array. | 0.01 |
| Controllable load #1 | Peak kW demand | Output channel #1 = 1 (0 = other control method) | e.g. Heater for hot water | 0.01 |
| Controllable load #2 | | | | 0.01 |
| Controllable load #3 | | | | 0.01 |

| Electricity Tariff | Integer | Start | End | Precision |
|---|---|---|---|---|
| Number of time periods | Up to 5 | | | |
| Period #1 | | Time on 24 hr clock | Time on 24 hr clock | minutes |
| Period #2 | | Time on 24 hr clock | Time on 24 hr clock | minutes |
| Period #3 | | Time on 24 hr clock | Time on 24 hr clock | minutes |
| Period #4 | | Time on 24 hr clock | Time on 24 hr clock | minutes |
| Period #5 | | Time on 24 hr clock | Time on 24 hr clock | minutes |

| | Site Default operation | |
|---|---|---|
| | Charge | Charge if time > t1 and < t2 |
| | Deliver power | Deliver power if time > t11 and < t12 |

Charge Control Flow Chart
    Example look-up tables: See FIGS. 12 and 13.
Power Delivery Control Flow Chart
    Example inverter & Battery look-up tables: See FIGS. 14 and 15.

The invention claimed is:

1. An electrical energy storage device comprising a unit for accommodation in a consumer site, the unit comprising:
    a single electrical connection arranged to detachably connect the unit directly to an AC circuit serving a plurality of consumer loads on the consumer site, the AC circuit serving consumer loads being connected to a mains power distribution system, and the electrical connection being via a mains plug;
    an energy store having an input arranged selectively to charge the energy store from the AC circuit serving the consumer loads via the electrical connection, and an output arranged selectively to discharge the energy store to the AC circuit serving the consumer loads via the electrical connection;
    a processor arranged to monitor at least one condition relating to the consumer site including the level of power demand of the plurality of consumer loads on the consumer site, and to monitor at least one condition relating to the energy store, and to control the energy store to charge or to discharge dependent upon the monitored conditions; and
    a communication interface for the processor, the interface being arranged to provide a remote communications link.

2. The electrical energy storage device as claimed in claim 1, comprising a communication interface for the processor.

3. The electrical energy storage device as claimed in claim 1, in which the condition relating to the consumer site further includes one or more of the level of power generated at the consumer site, the time and/or date, the tariff for purchasing power from the system, and the weather conditions at the consumer site.

4. The electrical energy storage device as claimed in claim 1, in which the condition relating to the energy store includes at least one of the energy store level, the voltage or temperature of the energy store, or the input or output current of the energy store.

5. The electrical energy storage device as claimed in claim 1, in which the processor is arranged to control the energy store in dependence upon one or more of a past value, a current value and a future value of the monitored conditions.

6. The electrical energy storage device as claimed in claim 1, in which the conditions are monitored either continuously or periodically.

7. The electrical energy storage device as claimed in claim 1, in which the processor is arranged to control the energy store to charge or discharge when both the condition(s) relating to the consumer site and the condition(s) relating to the energy store meet predetermined criteria.

8. The electrical energy storage device as claimed in claim 1, in which the processor is arranged to operate the energy store input to charge the energy store when power generated at the site exceeds power demand at the consumer site, if the energy store is below a predetermined level of charge.

9. The electrical energy storage device as claimed in claim 1, in which the processor is arranged to operate the output of the energy store to discharge when power demand on the site exceeds power generated on the site, if the energy store is above a predetermined level of charge.

10. The electrical energy storage device as claimed in claim 1, in which the processor is arranged to control the energy store input to charge at a time when the purchase price of power from the supply system is below a predetermined level, if the energy store is below a predetermined level of charge; and/or, in which the processor is arranged to control the energy store input to discharge at a time when the purchase price of power from the supply system is above a predetermined level, if the energy store is above a predetermined level of charge.

11. The electrical energy storage device as claimed in claim 1, in which the processor is arranged to receive instructions via the communications interface, and in which the processor comprises a memory for storage of instructions.

12. The electrical energy storage device as claimed in claim 11, in which the interface is arranged to be programmable by the user to provide or modify the instructions.

13. The electrical energy storage device as claimed in claim 1, in which the processor is arranged to determine the charging rate in dependence upon the monitored conditions, preferably including at least one of the charge level, the time available to charge, the power at which it is required to charge, or the amount of energy required to be stored in a given time.

14. The electrical energy storage device as claimed in claim 1, in which the energy store comprises a battery, and the device preferably includes an inverter for converting direct current from the energy store to alternating current for supply to the distribution system.

15. The electrical energy storage device as claimed in claim 1, in which the connection comprises a mains power connection connected to a distribution system such as the national grid, and in which the invertor preferably comprises a mains tied invertor.

16. The electrical energy storage device as claimed in claim 1, in which the device is arranged to be accommodated in a domestic setting, and in which the battery preferably has a usable capacity of more than about 2 kWh and/or less than about 4 kWh.

17. The electrical energy storage device as claimed in claim 1, in which the processor is arranged to receive instructions from the power distribution system, and to control the energy store dependent upon such instructions.

18. An energy management system comprising a plurality of devices as claimed in claim 1, and a controller for providing instructions to the devices.

19. A method of energy management in a system, in which a plurality of electrical energy storage devices are connected to the system, an electrical energy storage device from the plurality of electrical energy storage devices comprising:
    a single electrical connection arranged to detachably connect the electrical energy storage device directly to an AC circuit serving a plurality of consumer loads on the consumer site, the AC circuit serving consumer loads being connected to a mains power distribution system, and the electrical connection being via a mains plug;
    an energy store having an input arranged selectively to charge the energy store from the AC circuit serving the consumer loads via the electrical connection, and an output arranged selectively to discharge the energy store to the AC circuit serving the consumer loads via the electrical connection;
    a processor arranged to monitor at least one condition relating to the consumer site including the level of power demand of the plurality of consumer loads on the consumer site, and to monitor at least one condition relating to the energy store, and to control the energy store to charge or to discharge dependent upon the monitored conditions; and
    a communication interface for the processor, the interface being arranged to provide a remote communications link;
the method comprising:
    monitoring power demand in the system;
    communicating an instruction to charge an energy store of at least one electrical energy storage device connected to the system in the event that demand falls below a predetermined level; and
    communicating an instruction to discharge the energy store of at least one electrical energy storage device in the event that demand exceeds a predetermined level.

* * * * *

UNITED STATES PATENT AND TRADEMARK OFFICE
CERTIFICATE OF CORRECTION

PATENT NO. : 10,630,076 B2
APPLICATION NO. : 14/778768
DATED : April 21, 2020
INVENTOR(S) : Wordsworth et al.

Page 1 of 1

It is certified that error appears in the above-identified patent and that said Letters Patent is hereby corrected as shown below:

In the Claims

In Column 20, Line 6, in Claim 16, after "battery", delete "preferably"

In Column 20, Lines 7-8, in Claim 16, delete "2 kWh and/or less than about 4 kWh." and insert --2 kWh.-- therefor Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*